(12) United States Patent
Lee et al.

(10) Patent No.: US 9,040,963 B2
(45) Date of Patent: May 26, 2015

(54) ORGANIC LIGHT EMITTING DEVICE

(71) Applicant: Electronics and Telecommunications Research Institute, Daejeon (KR)

(72) Inventors: Jeong Ik Lee, Gyeonggi-do (KR); Chul Woong Joo, Seoul (KR); Jun-Han Han, Daejeon (KR); Joo Hyun Hwang, Seoul (KR); Nam Sung Cho, Daejeon (KR); Jin Woo Huh, Daejeon (KR); Jaehyun Moon, Daejeon (KR); Seung Koo Park, Daejeon (KR); Jin Wook Shin, Incheon (KR); Doo-Hee Cho, Daejeon (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 142 days.

(21) Appl. No.: 13/692,265

(22) Filed: Dec. 3, 2012

(65) Prior Publication Data

US 2013/0181194 A1    Jul. 18, 2013

(30) Foreign Application Priority Data

Jan. 18, 2012    (KR) .................... 10-2012-0005617

(51) Int. Cl.
| | |
|---|---|
| *H01L 29/08* | (2006.01) |
| *H01L 51/52* | (2006.01) |
| *H01L 33/46* | (2010.01) |
| *H01L 51/50* | (2006.01) |

(52) U.S. Cl.
CPC ......... *H01L 51/5203* (2013.01); *H01L 51/5036* (2013.01); *H01L 33/46* (2013.01); *H01L 51/5044* (2013.01)

(58) Field of Classification Search
CPC .............. H01L 51/5036; H01L 51/504; H01L 51/5044; H01L 33/46; H01L 51/5203
USPC ...................... 257/40, E51.022; 136/257, 263
See application file for complete search history.

(56) References Cited

U.S. PATENT DOCUMENTS

2006/0220509 A1* 10/2006 Ghosh et al. .................. 313/110
2007/0133628 A1*  6/2007 Komatsu et al. ................ 372/21

(Continued)

FOREIGN PATENT DOCUMENTS

| KR | 10-2003-0026424 A | 4/2003 |
|---|---|---|
| KR | 10-0628150 B1 | 9/2006 |

(Continued)

*Primary Examiner* — Brook Kebede
*Assistant Examiner* — Maria Ligai
(74) *Attorney, Agent, or Firm* — Rabin & Berdo, P.C.

(57) ABSTRACT

Provided is an organic light emitting device. The organic light emitting device comprising a first light emitting part on a substrate, emitting a first light of a first wavelength, wherein the first light emitting part includes a transparent first electrode, a first organic light emitting layer, and a transparent second electrode sequentially stacked on the substrate, a second light emitting part on the first light emitting part, emitting a second light of a second wavelength, wherein the second light emitting part includes a transparent third electrode, a second organic light emitting layer, and a reflective fourth electrode sequentially stacked on the first light emitting part, and a fluorescent material disposed at least one between the substrate and the first light emitting part, and between the first light emitting part and second light emitting part.

10 Claims, 6 Drawing Sheets

(56) References Cited

U.S. PATENT DOCUMENTS

| | | |
|---|---|---|
| 2009/0230415 A1* | 9/2009 | Ide et al. .......................... 257/98 |
| 2010/0096617 A1* | 4/2010 | Shanks ........................... 257/13 |
| 2011/0309337 A1* | 12/2011 | Nishimura et al. ............. 257/40 |
| 2012/0161114 A1* | 6/2012 | Kim et al. ....................... 257/40 |
| 2012/0197179 A1* | 8/2012 | Khan et al. ...................... 604/20 |

FOREIGN PATENT DOCUMENTS

| | | |
|---|---|---|
| KR | 10-2007-0008071 A | 1/2007 |
| KR | 10-0834342 B1 | 5/2008 |

* cited by examiner

ORGANIC LIGHT EMITTING DEVICE

CROSS-REFERENCE TO RELATED APPLICATIONS

This U.S. non-provisional patent application claims priority under 35 U.S.C. §119 of Korean Patent Application No. 10-2012-0005617, filed on Jan. 18, 2012, the entire contents of which are hereby incorporated by reference.

BACKGROUND OF THE INVENTION

The present invention disclosed herein relates to an organic light emitting layer, and more particularly, to a color tunable organic light emitting layer with high light extraction efficiency.

An organic light emitting device, for example, an organic light emitting diode is a light emitting device, where excitons occur when holes supplied from an anode electrode and electrons supplied from a cathode electrode are combined in an organic light emitting layer therebetween and they are recombined again. The organic light emitting diode as a self-light-emitting device is applied to a display device and developed due to its wide viewing angle, fast response sped, and high color reproduction rate. Furthermore, recent research and development on applying an organic light emitting diode are actively in progress.

FIG. 1 is a schematic view illustrating a layer stacked structure of a typical organic light emitting diode. The organic light emitting diode includes a sequentially stacked substrate 10, anode (i.e. a transparent electrode) 20, organic light emitting layer 30, cathode (i.e. a reflective electrode) 40, and protective layer 50.

The organic light emitting diode may be configured to emit R (red), G (green), and B (blue) separately, or to emit white color only. At this point, in order to express a desired color, a plurality of organic light emitting layers emitting a light of different wavelengths may be combined and used.

Korea Patent Application Publication No. 2007-0008071 discloses a technique that increases brightness and makes pixelization easy by stacking the widths of organic light emitting structures uniformly and vertically in order to make an area of a RGB sub pixel identical to that of a pixel. However, by such a structure, the light generated from a sub pixel at the middle is reflected at a sub pixel at the end, and then is emitted toward the external. As a result, light efficiency is deteriorated.

SUMMARY OF THE INVENTION

The present invention provides a color tunable organic light emitting device with high light extraction efficiency and color rendering.

Embodiments of the present invention provide organic light emitting devices comprising: a first light emitting part on a substrate, emitting a first light of a first wavelength, wherein the first light emitting part includes a transparent first electrode, a first organic light emitting layer, and a transparent second electrode; a second light emitting part on the first light emitting part, emitting a second light of a second wavelength, where the second light emitting part includes a transparent third electrode, a second organic light emitting layer, and a reflective fourth electrode; and a fluorescent material disposed at least one between the substrate and the first light emitting part, and between the first light emitting part and second light emitting part, wherein the fluorescent material receives the first and second lights and generates a third light of a third wavelength different from the first and second wavelengths.

At least one of the first and second light emitting parts may include a micro-resonator, and the fluorescent material is disposed between the micro-resonator and the substrate.

The organic light emitting device may further comprise a capping layer between the first light emitting part and the second light emitting part, and the capping layer reflects the first light and transmitting the second light.

The capping layer may be disposed on the second electrode of the first light emitting part.

The first electrode may be an anode and the second electrode may be a cathode.

The capping layer may reflect more than about 40% of the first light, and may transmit more than about 60% of the second light.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 2:
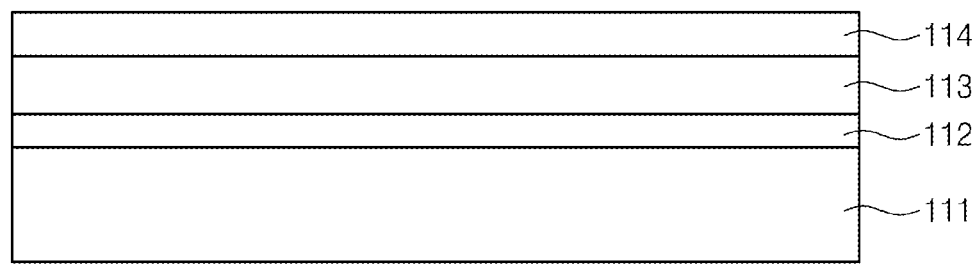
FIG. 2 is a schematic view illustrating an organic light emitting device according to an embodiment of the present invention.

FIG. 2 is a schematic view illustrating an organic light emitting device according to an embodiment of the present invention.

The organic light emitting device of FIG. 2 includes a substrate 111, a first electrode 112, an organic light emitting layer 113, and a second electrode 114, which are sequentially stacked.

The substrate 111 provides a mechanical strength to the organic light emitting device and also serves as a transparent window. The substrate 111 may be formed of glass or plastic having light transmitting property. In the case of plastic, polyethylene terephthalate (PET), polycarbonate (PC), and poly ethersulfone (PES), polyimide (PI) may be used.

The first electrode 112 may be an anode or a cathode. For convenience of description, it is assumed hereinafter that the first electrode 112 is an anode and a transparent electrode of ITO.

The second electrode 114 has a polarity that is paired with the first electrode 112. For example, if the first electrode 112 is an anode, the second electrode 114 is a cathode, and if the first electrode 112 is a cathode, the second electrode 114 is an anode.

The organic light emitting layer 113 is an element which includes organic matter and generates light by using the power provided from the first electrode 112 and the second electrode 114. For example, an Organic Light Emitting Diode (OLED) is a self-light-emitting type device that generates a light of a specific wavelength as electrons and holes are recombined in the organic light emitting layer 113 in order to emit energy when electric filed is applied. A basic structure of the OLED includes an anode (i.e. an ITO layer), a hole injection layer, a hole transfer layer, a light emitting layer, an electron transfer layer, an electro injection layer, and a cathode (i.e. a metal electrode), which are in the order close to the substrate 111. Hereinafter, a layer between the both electrodes 112 and 114 (more specifically, i.e. a hole injection layer, a hole transfer layer, a light emitting layer, an electron transfer layer, and an electron injection layer) is designated as an organic light emitting layer.

The organic light emitting layer is a key element for lighting source. Based on a device structure, there may be a stack structure, a single light emitting layer structure, a horizontal RGB structure, and a down conversion structure. Among them, the stack structure is typically used because it is easily manufactured and high efficiency is obtained. Additionally, according to a material used, there may be fluorescence, phosphorescence, and hybrid white OLED. If fluorescence is used, device stability may be excellent but high efficiency may be hardly obtained. Also, if phosphorescence is used, high efficiency may be obtained but stable blue color may be hardly obtained. As efforts to complement two materials' issues, research on a hybrid method, which uses fluorescence as blue color and uses phosphorescence as other colors, is being actively in progress.

Figure 3:
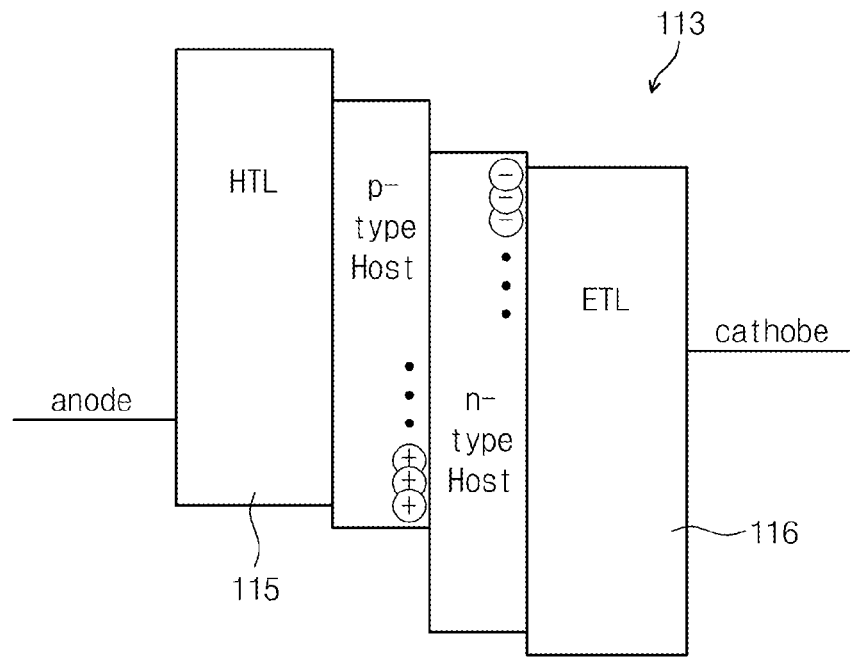
FIG. 3 is a schematic view illustrating a structure of a phosphorescent white OLED device including a light emitting layer of two layers.

As shown in FIG. 3, which illustrates a structure of a phosphorescent white OLED device, a structure of a phosphorescence device includes a two-layer light emitting layer 113 as a basic frame, in addition to a hole injection/transfer layer 115 and an electron injection/transfer layer 116. Here, the light emitting layer 113 includes a p-type host and an n-type host, each with a HOMO/LUMO structure having a high hole injection and electron injection barrier. Such a structure may be similar to that of a PN junction in an LED, and current loss may be minimized by limiting a recombination zone within the two hosts. At this point, materials are required to have higher triplet energy than blue phosphorescent dopant and not too low hole mobility or electron mobility in addition to electrical/chemical/thermal stabilities. Here, if there is a material for a hole transfer layer or an electron transfer layer, which has high charge mobility and higher triplet energy than blue phosphorescent dopant, a high degree of freedom in designing a device structure may be provided.

The key to develop a phosphorescent white OLED device is to develop a new material having wide triplet energy. It is important to have wide triplet energy that maintains existing charge mobility and stability in a hole transfer layer and an electron transfer layer in addition to a host, and does not dissipate the triplet energy of a blue phosphorescent dopant. Furthermore, it is also important to reduce the number of dopants in order to obtain manufacturability. In order to obtain a wide color reproduction range, a dopant having narrow spectrum is preferably used as a dopant for display. In order to obtain a high color rendering index number with the small number of dopants, a dopant having wide spectrum is preferably used as a dopant for lighting. Accordingly, the development of an OLED material for lighting is required separated from that of an OLED material for display.

Furthermore, a hybrid white OLED is an element that replaces phosphorescence, which causes blue color issue in blue color phosphorescent white OLED device, with fluorescence. The hybrid while OLED may be classified into a triplet harvesting type and a direct recombination type.

Figure 4:
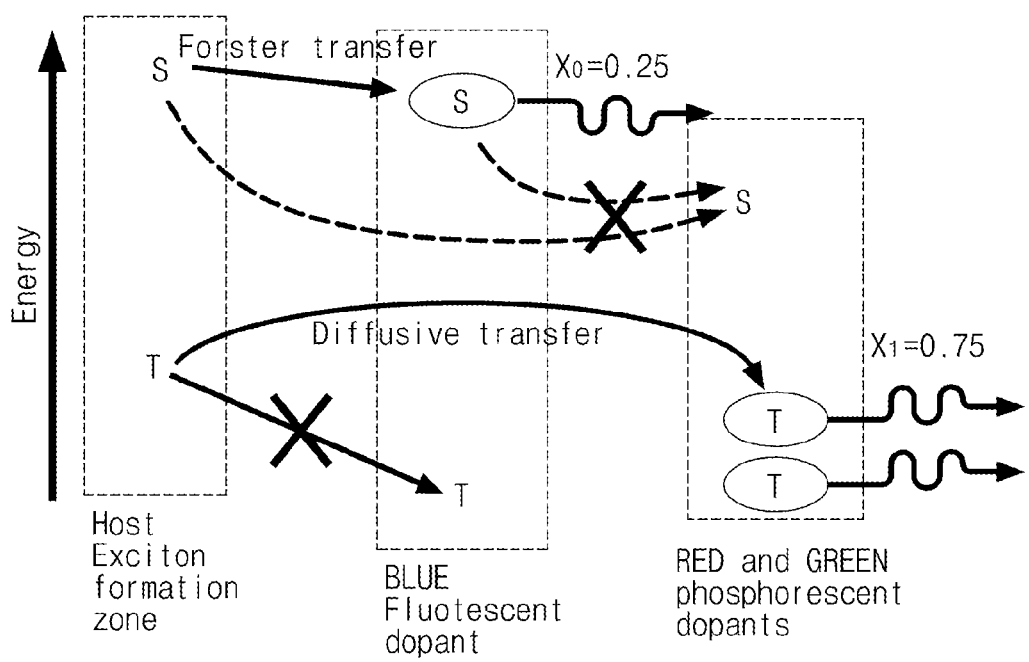
FIG. 4 is a schematic view illustrating an operating principle of a triplet harvesting type hybrid white OLED.

First, the triplet harvesting type is a very attractive method in that it can theoretically change all current into light energy. That is, since the triplet harvesting type could obtain efficiency and device stability like a phosphorescent white OLED, it has drawn much attention from researchers. In relation to the principle that such a type device operates, as shown in FIG. 4, which illustrates the operation principle of a triplet harvesting type hybrid white OLED, most of the recombination in a fluorescent layer, and accordingly, blue light emission is obtained by the singlet exciton of the fluorescent layer. A triplet, which is not used in the recombination zone of the fluorescent layer, transfers to a phosphorescent layer through diffusive transfer, thereby obtaining green and red phosphorescent emission. With such a principle, the singlet of about 25% is converted into the blue light emission of the fluorescent layer and the triplet of the remaining about 75% is converted into the green/red light of the phosphorescent layer, so that 100% conversion efficiency may be achieved.

The important issue in such a device is to control a recombination zone to be limited to the fluorescent layer, and adjust energy transfer in order to allow triplet excitons to occur only in the phosphorescent layer. Such a type hybrid device may not be substantially used due to demanding operational conditions. That is, since the triplet excitons of the fluorescent layer need to transfer to the phosphorescent layer to the maximum without loss, a path for that becomes extinct by a non light emitting process in the fluorescent layer, or becomes extinct after transferring from the phosphorescent layer to the fluorescent layer again. That is, extinct paths need to be considered. At this point, since information on conditions for generating a desired path faster than other extinct paths is insufficient, it is difficult to design and expect a device.

Figure 5:
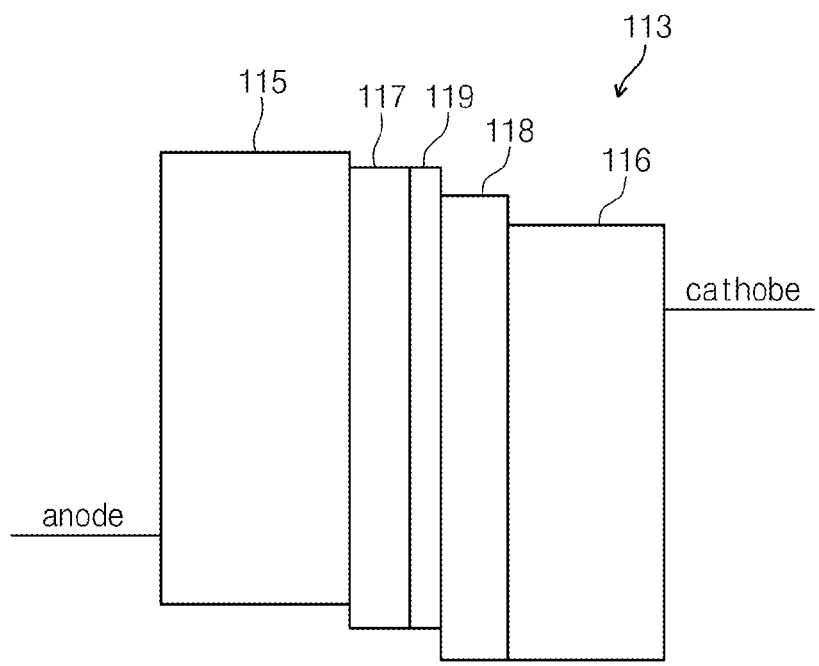
FIG. 5 is a schematic view illustrating a structure of a direct recombination type hybrid white OLED.

As shown in FIG. 5, which illustrates a direct recombination type hybrid white OLED structure, this type device uses a method through which light emission is obtained from both fluorescence and phosphorescence by forming a recombination zone in both the fluorescent layer 118 and the phosphorous layer 117 through adjustment. Since the triplet excitons of the blue fluorescent layer may not be used, efficiency may be lower compared to the above-mentioned triplet harvesting type. However, this type device may utilize a wide variety of materials and may have a structure having a high degree of freedom in designing a device. In this type device, the role of an interlayer 119 that separates a fluorescent layer from a phosphorescent layer is very important. That is, the interlayer 119 serves to adjust a recombination zone to be formed over a fluorescent layer and a phosphorescent layer, and also serves to prevent the triplet excitons of a phosphorescent layer from transferring to a fluorescent layer and becoming extinct.

As another challenge that needs to be overcome in an organic light emitting device such as the above-mentioned OLED, there is a light extraction issue.

As mentioned above, a material used for a light emitting layer in an OLED includes fluorescence and phosphorescence. Since a phosphorescent OLED may use all excitons, which are generated through recombination, for light emission, a theoretical internal quantum efficiency is 100%. That is, the efficiency is about four times than that of a fluorescent OLED, but the material has a short life cycle. However, due to the active development of phosphorescent materials, their internal quantum efficiency and life cycle are greatly improved, and thus, they are now used in commercial products. However, even if the internal quantum efficiency of an OLED is about 100%, only about 20% of the emission amount is emitted the external, about 80% thereof is lost due to a wave-guiding effect resulting from a refractive index difference between the substrate 111 and the ITO first electrode 112 and organic light emitting layer 113 and a total reflection effect resulting from a refractive index difference between the substrate 111 and air.

A refractive index of the organic light emitting layer 113 is about 1.6 to about 1.9, and a refractive index of ITO typically used as an anode is about 1.9 to about 2.0. The two layers have a thin thickness of about 100 nm to about 400 nm, and a refractive index of glass typically used as the substrate 111 is about 1.5. Thus, a planar waveguide is naturally formed. According to calculations, the light lost in an internal guided mode due to the above reason is about 45%. Additionally, since the refractive index of the substrate 111 is about 1.5 and the refractive index of air is about 1.0, the light incident at an angle greater than a critical angle is total-reflected when escaping from the substrate 111 to the external, and thus is tripped in a substrate inside. Since the light trapped therein is about 35%, only about 20% of the emission amount is emitted to the external.

Due to such a low light extraction efficiency, the external light efficiency of an OLED stays in a low level. Therefore, a light extraction technique becomes a core technology that improves the efficiency, brightness, and life cycle of an OLED lighting panel.

A technique for extracting the trapped light from an organic light emitting layer/ITO layer to the external through a refractive index difference between an anode (i.e. ITO) and a substrate is called internal light extraction, and a technique for extracting the trapped light from a substrate to the external (i.e. air) is called external light extraction.

In relation to the external light extraction, the improvement of realistic light efficiency is limited to about 1.6 times and color change occurrence according to a viewing angle, which results from diffraction phenomenon, needs to be minimized The external light extraction technique includes a method of forming a Micro Lens Array (MLA), an external scattering layer, and an anti-reflective film.

The internal light extraction technique may theoretically improves external light efficiency more than about three times, but affects an internal OLED interface surface very sensitively. Therefore, in addition to optical effect, electrical, mechanical, and chemical characteristics should be satisfied.

The internal light extraction technique includes a method of forming an internal scattering layer, a substrate surface modification, a refractive index adjusting layer, a photonic crystal, and a nano structure.

Figure 6:
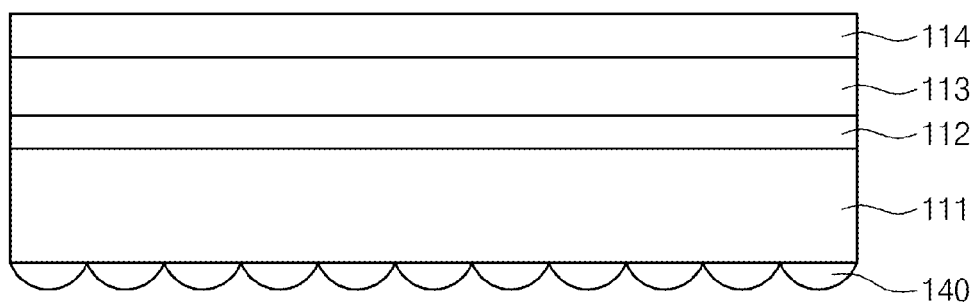
FIG. 6 is a schematic view illustrating a light extraction principle of a micro lens array.

In relation to the external light extraction, the MLA includes to a plurality of lenses, which are two-dimensionally disposed on a plane of a flat substrate that faces air. Each lens has a diameter of less than about 1 mm. As shown in FIG. 6, which illustrates a light extraction principle of the MLA, since an incident angle of light with respect to the surface tangent of the micro lens 140, which is curved than a plane, becomes less than a critical angle, the light is not trapped by total reflection and is extracted to the external. A medium of the MLA is made of a material having the same refractive index as the substrate 111 and has a diameter of several tens of $\mu m$. As the density of the micro lens 140 becomes higher, light extraction efficiency is increased, and according to the shape of a lens, light distribution is changed. When an external light extraction structure is attached to the substrate external by using the MLA, efficiency increase of about 50% is provided.

In the external light extraction, an external scattering layer may be manufactured in a sheet shape and then is attached to the substrate external through a similar method of forming an MLA sheet. Or, an external scattering layer may be manufactured by coating a substrate with a manufactured solution and hardening the coated substrate. Since there is no color change and interference color according to a viewing angle in the external scattering layer and Lambertian distribution is maintained after light passes through a light scattering layer, this light extraction structure may be applicable to a white OLED lighting panel. However, if a light scattering layer becomes thicker and light scattering particles form a multi layered structure, scattering effect of a short wavelength becomes greater than that of a long wavelength so that a transmission color has yellowish red. This should be taken care of. In order to minimize a spectrum change due to a scattering effect difference according to a wavelength, the refractive index, size, and density of scattering particles and also the refractive index and absorption spectrum of materials need to be adjusted. In an external fluorescent colloid structure, a ratio of the absorbed light to the scattering and re-emitting light may vary sensitively according to a thickness, a fluorescent size, and a concentration, so that it should be designed carefully. It may be effective to form a light scattering layer by using a polymer sheet containing small air bubbles. Since the refractive index of air bubble is about 1.0 and the refractive index of a material is about 1.5, there is a great refractive index difference, and thus, light scattering effect becomes larger. Therefore, it is advantageous to minimize spectrum change by relatively minimizing the thickness of a light scattering layer.

In the external light extraction, an anti-reflective film refers to a layer, which is formed by thinly stacking one-to-three layers of materials such as dielectic substances on the section of an optical device, in order to remove the light reflection due to a drastic refractive index change at the section of the optical device and increase the amount of transmitting light. When light reflection occurs two times (i.e. when the light is incident to a glass substrate and is transmitted through it), the light of about 8% is lost. In the OLED, because of a device structure, if light is emitted to the external air, one time reflection occurs. Thus, light extraction efficiency may be increased by about 4% when an anti-reflective film is used for external light extraction. When the minimum reflection of perpendicularly-incident light is required in relation to a single wavelength light, a material having a refractive index corresponding to the square root of a refractive index of a substrate for deposition is deposited with a thickness of the one-fourth wavelength of the material. However, if the minimum refractive index is required with respect to several wavelengths in a visible ray area, several layers of different materials may be deposited.

Figure 7:
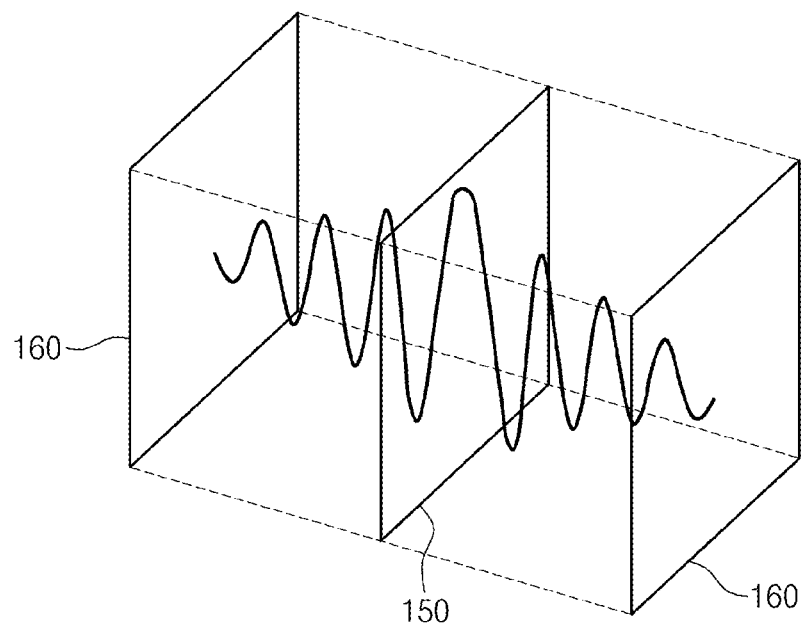
FIG. 7 is a schematic view illustrating a principle of a micro-resonator using a Bragg minor.

In the internal light extraction, a micro-resonator is also called micro-cavity. As shown in FIG. 7, which illustrates the principle of the micro-cavity using a Bragg mirror, a spacer layer 150 is disposed between the brag mirrors 160 or metal mirror layers in order to generate resonance.

Since the thickness of the spacer layer 150 has the size of a wavelength that generates standing waves of visible ray, the term "micro" is given. In the OLED, the micro-cavity includes a strong cavity and a weak cavity. The OLED includes a weak cavity structure without specially designing a cavity structure. As a basic structure, an organic light emitting layer having a refractive index of about 1.6 to about 1.9 is stacked at the center with a thickness of several hundreds of nm, and an ITO (for example, an anode) layer and metal cathode layer having a refractive index of about 1.9 are stacked at the both of the organic light emitting layer, so that a natural micro-cavity structure is formed. Therefore, light extraction efficiency varies greatly according to a thickness of an organic light emitting layer and a thickness of an ITO layer. Especially, as a relative position of a recombination zone changes, a ratio of a light extraction mode with respect to an internal/external guided mode changes from about 22% into about 55%.

Additionally, if the thickness of a cathode exceeds by $\lambda/4$ with respect to a wavelength $\lambda$ of light, light extraction efficiency is decreased, so that it may be less than $\lambda/4$.

A tandem structure using an organic light emitting layer as a multi layered structure may use a micro-cavity structure variously, and thus, may be used in manufacturing a color modulation OLED panel. In relation to the micro-cavity structure, before each layer of an OLED device is deposited, a Bragg mirror layer is deposited through a similar deposition method, and each layer's thickness is adjusted. Therefore, there is no need to worry about surface abnormality due to a light extraction structure, and the micro-cavity structure is easily applicable to panel production. However, there is a big limitation in using the micro-cavity structure for the internal light extraction of an OLED lighting panel. That is, all micro-cavities necessarily accompany spectrum narrowing. As a strong micro-cavity structure is used more, spectrum narrowing becomes stronger, so that only the light in a very narrow wavelength area is emitted strongly. However, the light emitting efficiency of the light having a wavelength not in a corresponding wavelength area is reduced.

Accordingly, in the case of an OLED lighting panel using a white OLED device, when the micro-cavity structure is used, the light emission color of the panel may easily deviate from a white color range. Also, since light extraction efficiency is decreased in an area other than a specific wavelength area, total light extraction efficiency may be decreased. Micro-cavity effect may be applied to a display panel that emits each RGB color, or a single color OLED panel.

Photonic crystal in the internal light extraction refers to a structure, in which two materials having different dielectric constants are arranged in a nm scale in order to allow or prevent transmission according to the wavelength of light, thereby only transmitting or reflecting only the light of a specific wavelength. Herein, a prohibited wavelength zone is called a photonic band gap. Through this phenomenon, it is possible to manufacture an optical device that may change an optical path with almost no loss. The photonic crystal has three types including a one dimensional photonic crystal (which is called a Bragg grating), a two dimensional photonic crystal (where embossing projections are arranged on a plane periodically, and a three dimensional photonic crystal. The photonic crystal uses the diffraction of light. That is, when a photo crystal structure is disposed on a planar optical waveguide formed in an OLED inside in order to prevent the light from being transmitted in a plane direction, a prevention band is formed. Therefore, the light generated in an organic light emitting layer does not form a guided mode so that it is emitted to the external. Through this phenomenon, a two dimensional photonic crystal structure is formed in an OLED, thereby improving light extraction efficiency. However, the two dimensional photonic structure may be applied to a single color OLED but may increase the light extraction efficiency of a specific wavelength in an OLED lighting panel using a white OLED.

Since an internal scattering layer in the internal light extraction has no color change according to a viewing angle and Lambertian distribution occurs therein basically, uniform brightness is provided in a panel. Additionally, since a scattering layer is formed by mixing different types of materials and coating a glass substrate with the mixed material, its manufacturing processes are relatively simple. When the scattering layer is applied, light extraction efficiency is increased more compared to there is no light scattering layer. Moreover, less color changes according to a viewing angle and similar Lambertian distribution are provided. However, there should be sufficient scattering centers in order to maximize a scattering effect, but when there are too much scattering centers, since back scattering is also increased, the possibility that scattered light is absorbed in an organic light emitting layer is increased. Accordingly, only when scattering and internal absorption are optimized, light extraction efficiency is increased. However, this is the assumed case that there is no light absorption in the scattering layer. In most cases, when there is absorption in a scattering layer, the light efficiency increase due to light extraction effect is reduced due to the absorption of the scattering layer. Even if the absorbance of the scattering layer is less than about 0.1, light efficiency deterioration rather than light extraction effect occurs due to absorption. Therefore, in order to use the scattering layer as an internal light extraction structure, a thin thickness needs to be manufactured to have a visible ray absorption of less than about 0.1.

A nano embossing structure in the internal light extraction is a light extraction structure that takes only advantages of the above-mentioned photonic crystal and scattering layer. As described above, since the photonic crystal structure is used only for a specific wavelength band of light, it is unavailable for a white OLED. Also, since internal absorption occurs inevitably in the scattering layer, light extraction effect is reduced by half. In relation to the nano embossing structure, embossing structures of several hundreds of nm are used for an internal light extraction structure like the photonic crystal, but are arranged irregularly. The arranged nano embossing structures has diffraction effect partially, but serve as a single scattering layer. Therefore, light wavelength dependency, color change according to a viewing angle, and light distribution distortion disappear almost, and also, self absorption becomes almost negligible.

Figure 8:
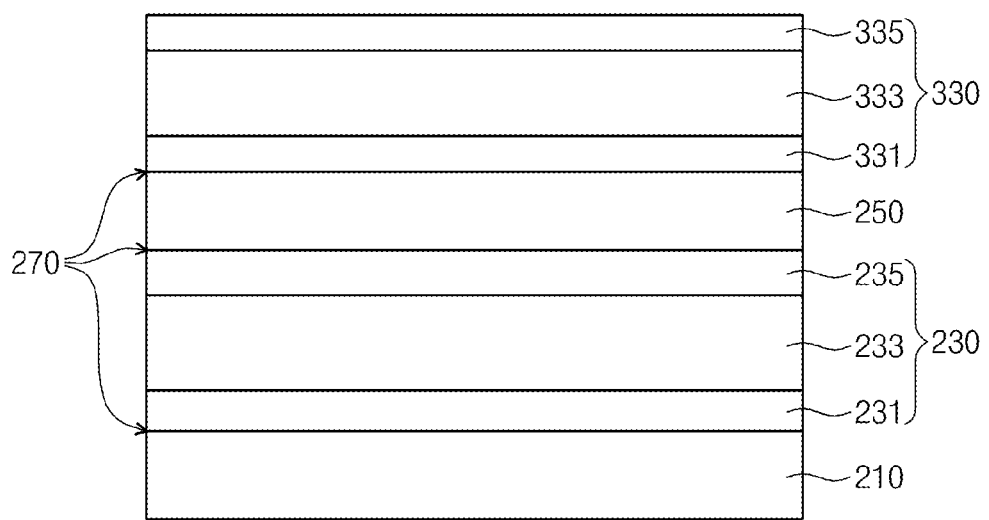
FIG. 8 is a schematic view illustrating an organic light emitting device according to an embodiment of the present invention.

FIG. 8 is a schematic view illustrating an organic light emitting device according to an embodiment of the present invention.

The organic light emitting device of FIG. 8 includes a luminous body having a first light emitting part 230 (where a first electrode 231, a first organic light emitting layer 233, and a second electrode 235 are stacked) and a second light emitting part 330 (where a third electrode 331, a second organic light emitting layer 333, and a fourth electrode 335 are stacked), and a fluorescent material 270 disposed at least one of on a substrate 210 surface, between the substrate 210 and the luminous body, and between the first and second light emitting parts 230 and 330 in order to receive the wavelengths of the light generated from each of the first and second light emitting parts 230 and 330 and then generate another wavelength of a light.

As shown in FIG. 8, two light emitting parts 230 and 330 are stacked. In more detail, provided is a first light emitting part 230 where a transparent first electrode 231, a first organic light emitting layer 233, and a transparent second electrode 235 are stacked to emit the first light of a first wavelength. Provided is a second light emitting part 330 stacked on the first light emitting part 230, where a transparent third electrode 331, a second organic light emitting layer 333, and a reflective fourth electrode 335 are stacked to emit the second light of a second wavelength. Provided is a fluorescent material 270 disposed at least one of on the substrate 210 surface, between the substrate 210 and the first light emitting parts 230, and between the first and second light emitting parts 230 and 330 in order to receive the wavelengths of the light generated from each of the first and second light emitting parts 230 and 330 and then generate the third light of a third wavelength different from the first and second wavelengths.

The organic light emitting device is a self-light emitting device where the first electrode 231, the organic light emitting layer 233, and the second electrode 235 are sequentially stacked. The first electrode 231 may be an anode or a cathode. At this point, the second electrode 235 may be a cathode corresponding to an anode or an anode corresponding to a cathode. Since a cathode uses a metal thin film, the first electrode 231 may be an anode and the second electrode 235 may be a cathode. An additional layer for performing an additional function may be disposed between the first electrode 231 and the organic light emitting layer 233 or between the organic light emitting layer 233 and the second electrode 235.

The fluorescent material 270 is disposed at least one of between the luminous body including the first and second light emitting parts 230 and 330 and the substrate 210, and between the first and second light emitting parts 230 and 330. The fluorescent material 270 is an element that receives and generates light according to characteristics of the fluorescent material itself. This is, the fluorescent material 270 generates a light having a different wavelength than a received light. The reason for this configuration is to improve a color rendering index.

The color rendering index (CRI) indicates that how close to a reference light an artificial light source represents the color of an object. As the CRI is closer to 100, colors are represented uniformly and naturally. If the CRI is small, it means that color distinction is vague under the lighting of an organic light emitting device. This CRI may be improved by replacing a fluorescent material.

Figure 1:
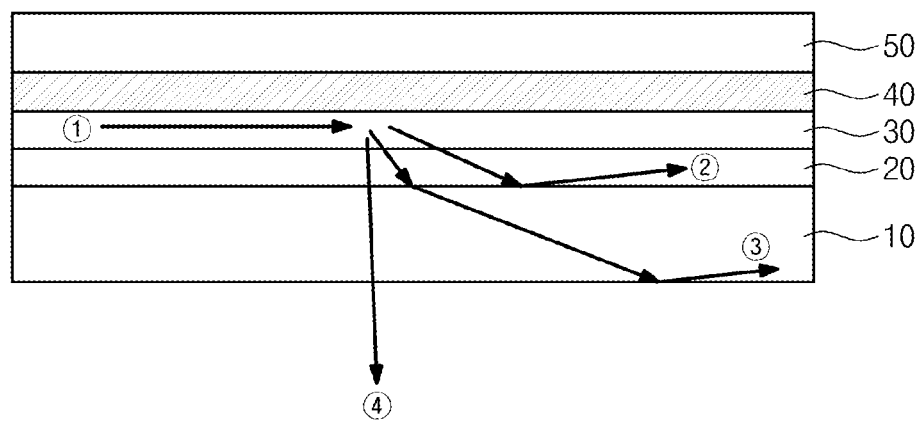
FIG. 1 is a schematic view illustrating a layer stacked structure of a typical organic light emitting diode.

The CRI relates to light extraction efficiency. As shown in FIG. 1, while the light generated from the organic luminous body passes through the organic light emitting, the first electrode, and the substrate and then is emitted to the external, due to a refractive index difference of each layer, a reflective light ① between the organic light emitting layer and the first electrode, a reflective light ② between the first electrode and the substrate, and a reflective light ③ between the substrate and air occur. Provided is a micro-resonator structure, which is a light extraction technique that increases the amount of light emitted to the external by reducing the reflective lights ① and ②.

In the organic light emitting device of the present invention, the light emitting parts 230 and 330 may include a micro-resonator structure (refer to FIG. 7) to improve light extraction efficiency. If the micro-resonator structure is applied, although light extraction efficiency is improved, spectrum becomes narrower. As a result, the CRI may be reduced. The fluorescent material 270 is used to improve such a narrowed spectrum.

The fluorescent material 270 receives the light having a narrowed spectrum and generates the light of another wavelength, in order to improve spectrum. At this point, in order for a normal operation of a fluorescent material, it is disposed between a light emitting part having a micro-resonator structure and a substrate. If looking at that from a different perspective, it is useful when the light emitting part 330 at the top of the fluorescent material 270, which is the highest based on the substrate 210 among the light emitting parts 230 and 330, includes a micro-resonator (i.e. a micro-resonator structure).

The fluorescent material 270 is disposed at least one of between the substrate 210 and the luminous body and between the light emitting parts 230 and 330. An example of its specific position is as follows.

The fluorescent material 270 is disposed on at least one of an adhesive layer bonding the light emitting parts 230 and 330, a capping layer protecting the light emitting parts 230 and 330, and the surfaces of the light emitting parts 230 and 330. Also, the fluorescent material 270 may be disposed on the surface of the substrate 210.

In order to firmly bond a plurality of light emitting parts, an adhesive layer may be formed between each light emitting part. At this point, by positioning/including the fluorescent material 270 on a corresponding adhesive layer, the fluorescent material 270 may be disposed without the thickness increase of the organic light emitting device.

Each of the light emitting parts 230 and 330 may include the capping layer 250 to protect each electrode and organic light emitting layer. At this point, by positioning/including the fluorescent material 270 on the capping layer 250, the fluorescent material 270 may be disposed without the thickness increase of the organic light emitting device.

Additionally, the fluorescent material 270 may be disposed on the surfaces of the light emitting parts 230 and 330. According to a structure of the organic light emitting device, the light emitting parts 230 and 330 may not include the adhesive layer or the capping layer. At this point, the fluorescent material 270 is disposed on the surfaces of the light emitting parts. For example, when the outer surfaces of the light emitting parts are the first electrode and the second electrode respectively, the fluorescent material 270 is disposed on the outer surface of the first electrode or the second electrode.

If one of the light emitting parts 230 and 330 has a micro-resonator, the fluorescent material 270 may be disposed between the one of the light emitting parts 230 and 330 having a micro-resonator and the substrate 210.

Hereinafter, an additional function of the capping layer protecting the light emitting parts and a function of the fluorescent material will be described. For convenience of description, the light emitting part including the capping layer 250 is called the first light emitting part 230, and another light emitting part stacked on the capping layer 250 is called the second light emitting part 330.

A function for improving light extraction efficiency may be added to the capping layer 250. For example, the capping layer 250 is configured to be stacked between the first light emitting part 230 and the second light emitting part 330 in order to reflect the light generated from the first light emitting part 230 and transmits the light generated from the second light emitting part 330.

At this point, the second electrode 235 in the first light emitting part 230, even though it is a metal thin film, is thinly formed with transparency in order to deliver the light of the second light emitting part 330 toward the substrate 210.

As a result, since the first electrode 231 and the second electrode 235 are formed of transparent electrodes, the first light emitting part 230 are transparent overall. The first light emitting part 230 emits the light of the first wavelength, generated from the organic light emitting layer 233, in all directions, and transmits the light of the second wavelength from the external as it is.

The capping layer 250 is stacked on the first light emitting part 230. When the first light emitting part 230 includes the sequentially stacked the first electrode 231, the first organic light emitting layer 233, and the second electrode 235, the capping layer 250 may be disposed on one of the positions ① below. Or, the capping layer 250 may be disposed in each electrode. That is, the capping layer 250 may be disposed between the layers of a double layer structure of each electrode.

①—the first electrode—the first organic light emitting layer—the second electrode—①

As shown in FIG. 8, the first light emitting part 230 is disposed on the substrate 210, and at this point, the capping layer 250 is disposed on the opposite side (i.e. outer surface) of the layer stacked interface of the second electrode 235 and the organic light emitting layer 233. In more detail, the organic light emitting device of FIG. 8 includes the sequentially stacked the substrate 210, the first electrode 231, the organic light emitting layer 233, the second electrode 235, and the capping layer 250. In brief, the substrate 210, the first light emitting part 230, the capping layer 250 are sequentially stacked, and if the first electrode 231 is an anode and the second electrode 235 is a cathode, the first light emitting part 230 includes the sequentially stacked substrate, anode, organic light emitting layer, cathode, and capping layer.

The capping layer 250 reflects the light of the first wavelength generated from the first light emitting part 230, more specifically, the organic light emitting layer 233. Moreover, the capping layer 250 transmits the light of a different first wavelength than a second wavelength.

Accordingly, when the capping layer 250 is stacked on the first light emitting part 230, the light of the first wavelength generated from the first light emitting part 230 is reflected by the capping layer 250, and then, is emitted toward one of the both sides of the first light emitting part 230. For example, when the capping layer 250 is disposed on the outer surface of the second electrode 235, the light of the first wavelength generated from the first organic light emitting layer 233 is not allow to be emitted toward the second electrode 235.

Additionally, the capping layer 250 transmits the light of the second wavelength. The light of the second wavelength is different from the light of the first wavelength. The light of the second wavelength is not generated from the first light emitting part 230, but flows from the external to the first light emitting part 230. Each of the first wavelength and second wavelength, mentioned in the present invention, may refer to one wavelength or a plurality of wavelengths. As shown in FIG. 8, if the light of the second wavelength inflows toward the second electrode 235, the light of the second wavelength is emitted toward the first electrode 231. At this point, the emission direction is identical to that of the light of the first wavelength.

Figure 10:
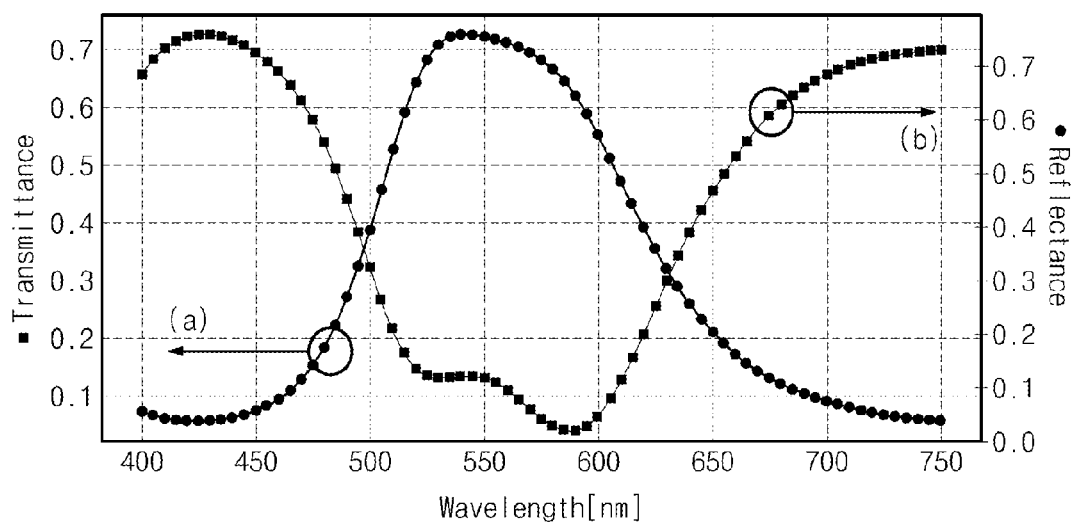
FIG. 10 is a graph illustrating the light transmittance and light reflectivity of a capping layer.

According to the above configuration, since the self-generated light from the first light emitting part 230 is emitted in only one direction due to the capping layer 250, light efficiency may be improved in a lighting system that emits light in one direction. Moreover, when the light of the second wavelength inflows from the external, it is reliably synthesized with the light of the first wavelength, and thus, color tuning becomes possible. The capping layer 250 may include a dielectric mirror having a layer stacked structure of dielectrics having different refractive indices. When dielectrics having different refractive indices are stacked, a mirror function, resulting from a refractive index difference at the layer stacked surface, is added. FIG. 10 is a graph illustrating the light transmittance (a) and light reflectivity (b) of a capping layer. As shown in FIG. 10, transmittance and reflectivity vary according to each wavelength. Thus, through those facts, optimized transmittance and reflectivity may be obtained.

According to the above configuration, when the fluorescent material 270 is disposed between the first light emitting part 230 and the substrate 210, the CRI with respect to a synthesized light of a first wavelength and a second wavelength is improved.

Figure 9:
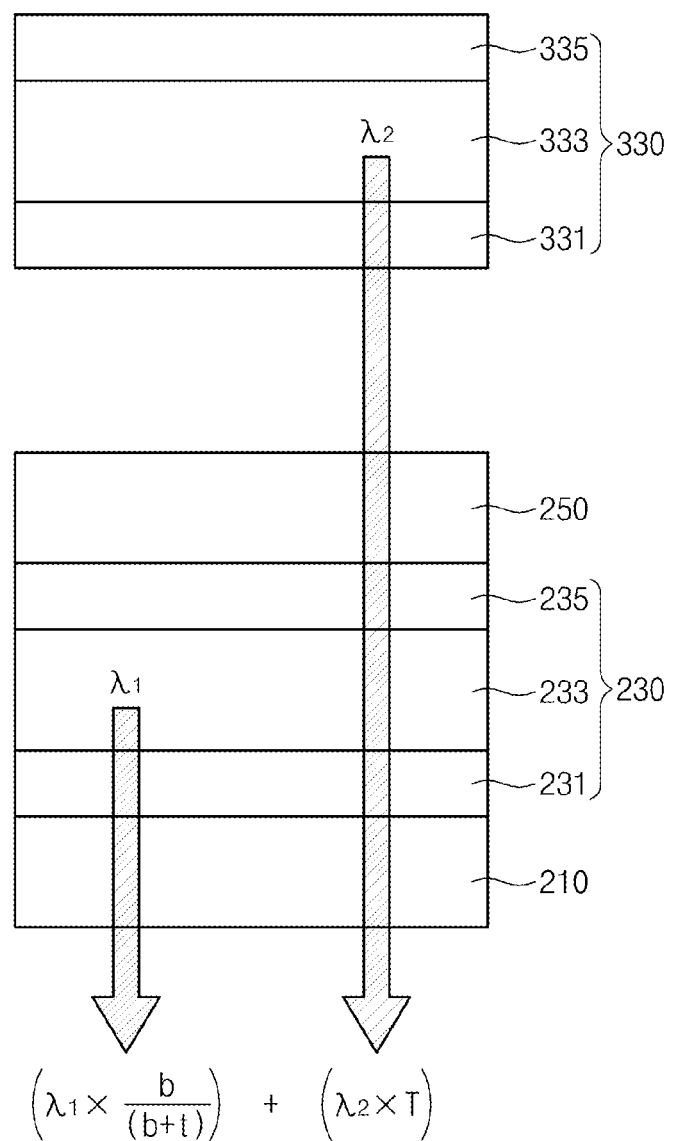
FIG. 9 is a schematic view illustrating an organic light emitting device according to another embodiment of the present invention.

FIG. 9 is a schematic view illustrating an organic light emitting device according to another embodiment of the present invention.

The organic light emitting device includes a first light emitting part 230 (where a first electrode 231, a first organic light emitting layer 233, and a second electrode 235 are stacked to emit the light of the first wavelength), a second light emitting part 330 (where a third electrode 331, a second organic light emitting layer 333, and a fourth electrode 335 are stacked to emit the light of the second wavelength) stacked, being toward the third electrode 331, on the first light emitting part 230, and a capping layer 250 stacked between the first organic light emitting layer 233 and the second organic light emitting layer 333 in order to reflect the light of the first wavelength and transmit the light of the second wavelength.

When looking at it, the first light emitting part 230 corresponding to a transparent OLED and the second light emitting part 330 corresponding to a reflective OLED are stacked to constitute a junction type organic light emitting device. The capping layer 250 is disposed between the first organic light emitting layer 233 and the second organic light emitting layer 333. As shown in FIG. 9, the capping layer 250 is stacked on the first light emitting part 230, more specifically, on the second electrode 235 of the first light emitting part 230 facing the second light emitting part 330. At this point, the capping layer 230 may serve to protect the first light emitting part 230.

At this point, the capping layer 250 may have a high reflectivity with respect to the light of the first wavelength generated from the first light emitting part 230, and may have a high transmittance with respect to the light of the second wavelength generated from the second light emitting part 330.

When the intensity of the light having a first wavelength is $\lambda_1$, the intensity of the light having a second wavelength is $\lambda_2$, a transmittance of the capping layer 250 with respect to a second wavelength is T, the intensity of the light having a first wavelength emitted toward the second electrode 235 in the first light emitting part 230 is t, and the intensity of the light having a first wavelength emitted toward the first electrode 231 in the first light emitting part 230 is b, the intensity of the total light emitted toward the first electrode is the sum of $\lambda_1 * b/(b+t)$ and $\lambda_2 * T$.

Accordingly, in order to improve the efficiency of the light emitted toward the first electrode 231, the capping layer 250 has a high transmittance with respect to the light of the second wavelength. Additionally, in order to increase b/(b+t), the capping layer 250 has a high reflectivity with respect to the light of the second wavelength.

As a result, the light of the first wavelength is not transmitted toward the second light emitting part 330 and is emitted toward the first electrode 231. Also, the light of the second wavelength is emitted toward the first electrode 231 due to the reflective fourth electrode 335. Since the light of the first wavelength is not emitted toward the second light emitting part 330, the light efficiency deterioration with respect to the light of the first wavelength is improved. Additionally, since the light of the first wavelength and the light of the second wavelength are synthesized in the first light emitting part 230, a desired color may be easily tunable.

Although an ideal situation is assumed to describe the function of the capping layer 250, but in reality, it is difficult to find a material having about 100% reflectivity with respect to a first wavelength and about 100% transmittance with respect to a second wavelength.

According to experiments, when the capping layer 250 has a reflectivity of more than about 40% with respect to the first wavelength and a transmittance of more than about 60% with respect to the second wavelength, it is confirmed that light efficiency is improved. Therefore, it is sufficient for the capping layer 250 to have a reflectivity of more than about 40% with respect to the first wavelength and a transmittance of more than about 60% with respect to the second wavelength.

At this point, the CRI may be increased when the fluorescent material 270 is disposed at least one of between the substrate 210 and the first light emitting part 230 and between the first light emitting part 230 and the second light emitting part 330. Especially, when the second light emitting part 330 includes a micro-resonator, the CRI with respect to the light of the second wavelength is drastically improved.

According to the present invention, an organic light emitting device includes a fluorescent material disposed between a substrate and a luminous body or between each light emitting part in order to receive wavelengths of the light generated from each light emitting part and generate light having another wavelength. Therefore, a color rendering index may be improved.

Especially, when a light emitting part has a micro-resonator, or has a capping layer that reflects the light of a specific wavelength and transmits the light of another wavelength, light extraction efficiency may be improved without reduction in color rendering index.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An organic light emitting device comprising:
 a first light emitting part on a substrate, emitting a first light of a first wavelength, wherein the first light emitting part includes a transparent anode in contact with the substrate, a first organic light emitting layer, and a transparent cathode corresponding to the transparent anode, which are sequentially stacked on the substrate, the cathode including a first surface facing the anode and a second surface opposite to the first surface;
 a second light emitting part on the first light emitting part, emitting a second light of a second wavelength, wherein the second light emitting part includes a transparent electrode, a second organic light emitting layer, and a reflective electrode sequentially stacked on the second surface of the cathode of the first light emitting part; and
 a fluorescent material disposed between the second surface of the cathode and the transparent electrode, wherein the fluorescent material receives the first and second lights and generates a third light of a third wavelength different from the first and second wavelengths.

2. The organic light emitting device of claim 1, at least one of the first and second light emitting parts includes a micro-resonator, and the fluorescent material is disposed between the micro-resonator and the substrate.

3. The organic light emitting device of claim 1, further comprising a capping layer between the first light emitting part and the second light emitting part, wherein the capping layer reflects the first light and transmits the second light.

4. The organic light emitting device of claim 3, wherein the capping layer is disposed on the cathode of the first light emitting part.

5. The organic light emitting device of claim 3, wherein the capping layer reflects more than about 40% of the first light, and transmits more than about 60% of the second light.

6. The organic light emitting device of claim 1, further comprising a capping layer between the second surface of the cathode and the transparent electrode of the second light emitting part, wherein the capping layer reflects the first light and transmits the second light, and
 wherein the second light emitting part includes a micro-resonator, and the fluorescent material is disposed between the capping layer and the second surface of the cathode.

7. The organic light emitting device of claim 1, further comprising a capping layer between the second surface of the cathode and the transparent electrode of the second light emitting part, wherein the capping layer reflects the first light and transmits the second light, and
 wherein the second light emitting part includes a micro-resonator, and the fluorescent material is disposed between the transparent electrode of the second light emitting part and the capping layer.

8. An organic light emitting device comprising:
 a first light emitting part on a substrate, emitting a first light of a first wavelength, wherein the first light emitting part includes a transparent cathode in contact with the substrate, a first organic light emitting layer, and a transparent anode corresponding to the transparent cathode, which are sequentially stacked on the substrate, the anode including a first surface facing the cathode and a second surface opposite to the first surface;
 a second light emitting part on the first light emitting part, emitting a second light of a second wavelength, wherein the second light emitting part includes a transparent electrode, a second organic light emitting layer, and a reflective electrode sequentially stacked on the second surface of the anode of the first light emitting part; and
 a fluorescent material disposed between the second surface of the anode and the transparent electrode, wherein the fluorescent material receives the first and second lights and generates a third light of a third wavelength different from the first and second wavelengths.

9. The organic light emitting device of claim 8, further comprising a capping layer between the second surface of the anode and the transparent electrode of the second light emitting part, wherein the capping layer reflects the first light and transmits the second light, and wherein the second light emitting part includes a microresonator, and the fluorescent material is disposed between the capping layer and the second surface of the anode.

10. The organic light emitting device of claim 8, further comprising a capping layer between the second surface of the anode and the transparent electrode of the second light emitting part, wherein the capping layer reflects the first light and transmits the second light, and wherein the second light emitting part includes a microresonator, and the fluorescent material is disposed between the transparent electrode of the second light emitting part and the capping layer.

* * * * *